United States Patent [19]

Moslehi

[11] Patent Number: 5,641,707

[45] Date of Patent: *Jun. 24, 1997

[54] DIRECT GAS-PHASE DOPING OF SEMICONDUCTOR WAFERS USING AN ORGANIC DOPANT SOURCE OF PHOSPHORUS

[75] Inventor: Mehrdad M. Moslehi, Los Altos, Calif.

[73] Assignee: Texas Instruments Incorporated, Dallas, Tex.

[*] Notice: The term of this patent shall not extend beyond the expiration date of Pat. No. 5,489,550.

[21] Appl. No.: 479,317

[22] Filed: Jun. 7, 1995

Related U.S. Application Data

[62] Division of Ser. No. 332,528, Oct. 31, 1994.

[51] Int. Cl.$^6$ .................................................. H01L 21/233
[52] U.S. Cl. ............................................ 438/513; 438/565
[58] Field of Search ...................................... 437/165, 166, 437/950, 959; 148/DIG. 40, DIG. 144

[56] References Cited

U.S. PATENT DOCUMENTS

| | | | |
|---|---|---|---|
| 4,504,331 | 3/1985 | Kuech et al. | 148/175 |
| 4,618,381 | 10/1986 | Sato et al. | 148/189 |
| 4,830,982 | 5/1989 | Dentai et al. | 437/94 |
| 4,904,616 | 2/1990 | Bohling et al. | 437/81 |
| 4,988,640 | 1/1991 | Bohling et al. | 437/81 |
| 5,015,747 | 5/1991 | Hostalek et al. | 556/1 |
| 5,128,275 | 7/1992 | Takikawa et al. | 437/81 |
| 5,156,461 | 10/1992 | Moslehi et al. | 374/121 |
| 5,242,859 | 9/1993 | Degelormo et al. | 437/165 |
| 5,275,966 | 1/1994 | Gedridge, Jr. | 437/81 |
| 5,293,216 | 3/1994 | Moslehi | 356/371 |
| 5,300,185 | 4/1994 | Hori et al. | 158/610 |
| 5,387,545 | 2/1995 | Kiyota et al. | 437/81 |
| 5,424,244 | 6/1995 | Zhang et al. | 437/173 |
| 5,489,550 | 2/1996 | Moslehi | 437/165 |

OTHER PUBLICATIONS

Ransom, et al., "Shallow n+ Junctions in Silicon by Arsenic Gas–Phase Doping", J. Electrochem. Soc., vol. 141, No. 5, pp. 1378–1381 (1994).

Nishizawa, et al., "Ultrashallow, High Doping of Boron Using Molecular Layer Doping", Appl. Phys. Lett., vol. 56, No. 14, Apr. 2, 1990, pp. 1334–1335.

Kiyota, et al., "Characteristics of Shallow Boron–Doped Layers in Si by Rapid Vapor–Phase Direct Doping", J. Electrochem. Soc., vol. 140, 140, No. 4, pp. 1117–1121, (1993).

Moslehi, et al., "MicroelectRonics Manufacturing Science and Technology: Single–Wafer Thermal Processing and Wafer Cleaning", TI Technical Journal, Sep.–Oct. 1992, pp. 44–53.

*Primary Examiner*—Chandra Chaudhari
*Attorney, Agent, or Firm*—Kay Houston; W. James Brady, III; Richard L. Donaldson

[57] ABSTRACT

A direct doping method for semiconductor wafers, comprising the steps of providing a semiconductor wafer, exposing the surface of the wafer to a process medium in order to directly dope at least a portion of the surface of the wafer, wherein the process medium comprises a dopant gas, and wherein the dopant gas comprises an organic compound of a dopant species, and heating the wafer, thermally activating the direct doping process and causing solid-state diffusion of the dopant species into the semiconductor wafer surface. The organic source of a dopant species includes the organic compounds comprising boron, arsenic and phosphorous. The wafer is heated in the presence of an organic dopant source, thermally activating the doping process and causing surface chemisorption, surface dissociation, and solid-state diffusion of the dopant species into the wafer surface. The organic dopant source can be used with a germanium-containing additive gas, a halogen-containing compound or a remote plasma energy source.

31 Claims, 2 Drawing Sheets ized semiconductor materials using tri-
isopropylantimony as the source of antimony. This method
is not a gas-phase doping process since in-situ doping takes
place during a material layer deposition process.

U.S. Pat. No. 5,242,859 issued to Degelormo et al. is
directed to a method of doping a semiconductor surface with
the use of an oxidizing agent.

U.S. Pat. Nos. 4,988,640 and 4,904,616, both issued to
Bohling et at., describe methods of using fluorinated orga-
nometallic compounds, particularly arsine, antimony and
phosphine substitutes, for in-situ doping during epitaxial
growth, ion implantation, and diffusion doping.

U.S. Pat. No. 4,618,381 issued to Sato et al. discloses a
doping method of adding impurities to a semiconductor base
material in a vacuum chamber using a glow discharge
(plasma excitation) at less than 400° C. This is otherwise
known in the industry as a Plasma Immersion Ion Implan-
tation (PIII) process, and is a type of ion implantation using
low-energy ions.

DIRECT GAS-PHASE DOPING OF SEMICONDUCTOR WAFERS USING AN ORGANIC DOPANT SOURCE OF PHOSPHORUS

This is a division, of application Ser. No. 08/332,528, filed Oct. 31, 1994.

CROSS-REFERENCE TO RELATED APPLICATIONS

Refer to U.S. Patent Applications "Method for Doped Shallow Junction Formation Using Direct Gas-Phase Doping," filed on Aug. 1, 1994 by Moslehi, Ser. No. 08/283,979 now U.S. Pat. No. 5,599,735, and "Improved Gas Phase Doping Method Using Germanium-Containing Additive" filed Aug. 9, 1994 by Moslehi, Serial Number 08/287,570, now U.S. Pat. No. 5,489,550.

FIELD OF THE INVENTION

This invention relates generally to the field of fabrication of microelectronics and integrated circuits, and more par-
ticularly to a method of adding impurities or dopants to the surface of semiconductor devices using a gas-phase doping process comprising an organic dopant source and thermal process activation.

BACKGROUND OF THE INVENTION

Semiconductors are widely used in integrated circuits for electronic applications, including various information sys-
tems. Such integrated circuits typically use multiple bipolar junction transistors (BJT) and/or metal-oxide semiconductor field-effect transistors (MOSFET) fabricated in single-
crystal silicon substrates. Many integrated circuits now require the introduction of dopants to one or more device junction layers for formation of the transistor device struc-
tures. There are several methods of introducing dopants to an integrated circuit surface, including epitaxial layer depo-
sition with in-situ doping, chemical-vapor deposition (CVD) with in-situ doping, metal-organic chemical-vapor deposi-
tion (MOCVD) with in-situ doping, ion implantation, plasma-immersion ion implantation (PIII), and thermal gas-
phase doping.

Several prior art references disclose methods of metal-
organic chemical-vapor deposition (MOCVD) of semicon-
ductor layers using organometallic precursors. U.S. Pat. No. 5,128,275 issued to Takikawa et at. discloses a method of growing a compound semiconductor layer by a metal-
organic chemical-vapor deposition process. U.S. Pat. No. 5,015,747 issued to Hostalek et at. discloses the use of an organometallic compound for gas-phase deposition of metal on substrates. U.S. Pat. No. 5,300,185 issued to Hori et al. teaches a method of growing a III-V group compound semiconductor on a substrate by an MOCVD method. U.S. Pat. No. 4,830,982 issued to Dentai et al. discloses a method of forming epitaxial layers of Group III-V based semicon-
ductor compounds produced by a MOCVD process through the use of organic titanium-based compounds. U.S. Pat. No. 4,504,331 issued to Kuech et al. describes an improved method of growing silicon doped gallium arsenide by MOCVD by adding a small amount of disilane to the gas-phase ambient. None of the above-mentioned prior art references discloses a method for gas-phase doping of a semiconductor layer.

U.S. Pat. No. 5,275,966 issued to Gedridge, Jr. discloses a low temperature CVD process for producing antimony-

SUMMARY OF THE INVENTION

The present invention encompasses using an organic source of a dopant species, including the organic compounds comprising boron, arsenic and phosphorous for thermally activated gas-phase doping of semiconductor wafers. This is especially important for fabricating device junctions with channel depths of less than 1000 Å. The wafer is heated in the presence of an organic dopant source, thermally activat-
ing the process by heating the substrate through a pre-
specific thermal trajectory, and causing surface adsorption and solid state diffusion of the dopant species into the wafer surface. The organic dopant source can be used with or without a germanium containing additive gas, and with or without a halogen-containing additive compound.

One embodiment of the present invention is a direct doping method for semiconductor wafers, comprising the steps of providing a semiconductor wafer, exposing the surface of the wafer to a non-ionized (nonplasma) process medium in order to directly dope the surface of the wafer, where the process medium comprises a dopant gas, and where the dopant gas comprises an organic compound of a dopant species. The wafer is then heated, thermally activat-
ing the process and causing surface adsorption and solid state diffusion of the dopant species into the semiconductor wafer surface. The doping method is performed without the presence of plasma and strictly based on a thermal activation process.

Another embodiment of the present invention is a ther-
mally activated doping method for semiconductor wafers, comprising the steps of providing a semiconductor wafer and exposing the surface of the wafer to a process medium in order to directly dope the surface of the wafer. The process medium comprises a dopant gas, and the dopant gas comprises an organic compound of a dopant species. The doping method is conducted in a thermal processing reactor, and the semiconductor wafer is heated to facilitate the solid state diffusion of the dopant species into the surface of the semiconductor wafer.

Some advantages of the invention over the conventional doping methods include the ability to increase the dopant introduction rate into exposed silicon regions, resulting in an increased doping process throughput rate, and the ability to reduce the time of the process and make the doped junction even shallower for a given surface concentration. With this invention, the junction depth can be reduced, yet still be heavily doped. In contrast to the ion implantation processes, the crystal lattice structure is not damaged, and there is no need for a subsequent high temperature anneal to repair crystal damage or remove defects after direct gas-phase doping. Also, the gas-phase doping process is selective to the dopant species so that only the desired dopant atoms are diffused into the wafer surface. Another advantage of the present invention is improved safety since many organic dopant sources are safer for use compared to the inorganic dopant sources such as arsine, diborane, and phosphine.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

Figure 1:
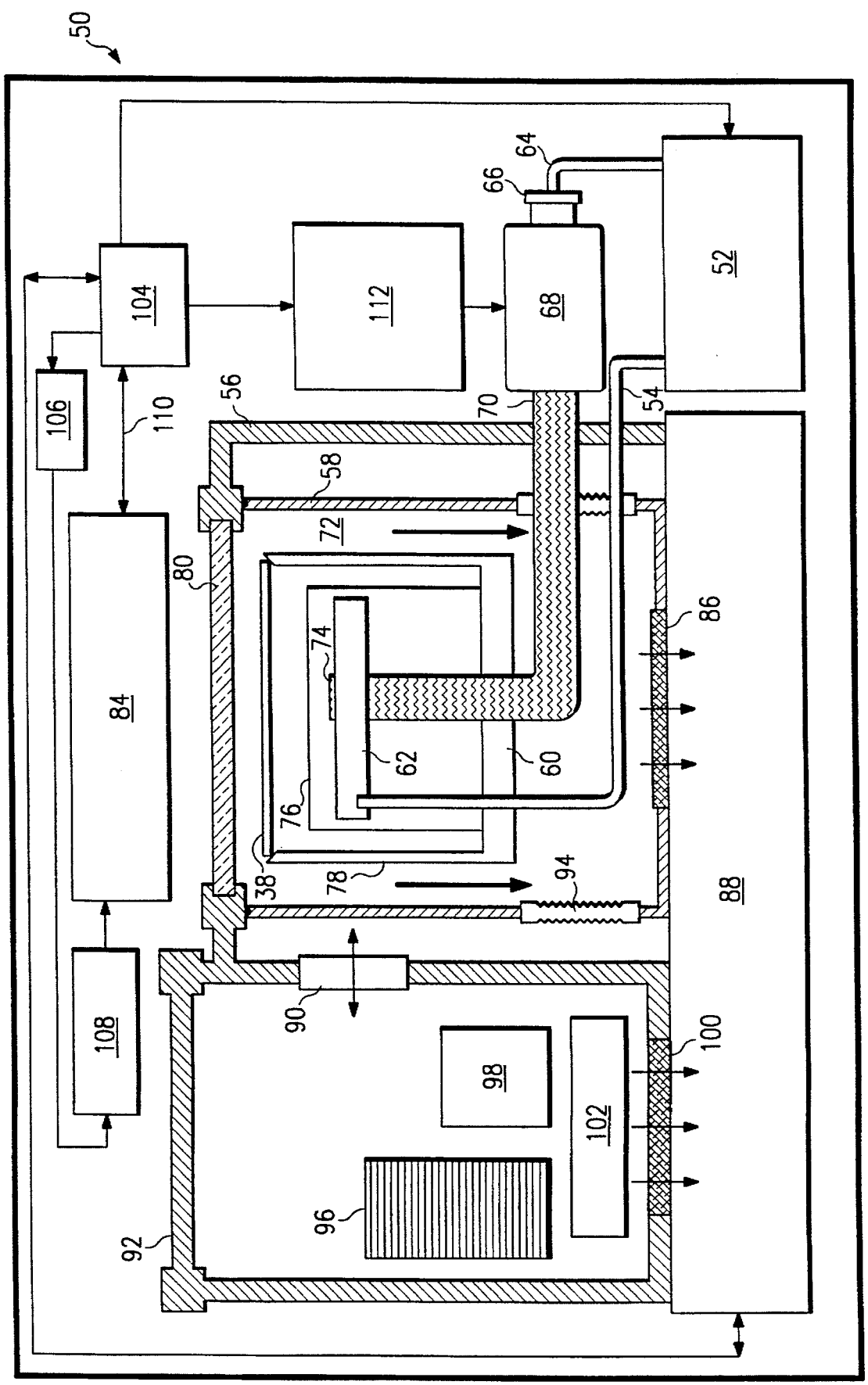
FIG. 1 is a schematic representation of a typical environment of the preferred embodiment, a single-wafer semiconductor fabrication reactor, such as a rapid-thermal processing (RTP) reactor.

With ion implantation, dopants are introduced into a semiconductor wafer surface by bombarding the substrate with energetic ions of the dopant species. Ion implantation technology has been widely used in semiconductor device manufacturing because of its superior controllability, relatively high manufacturing throughput, and its capability to form device junctions with a wide range of junction depths, but has now been found to have several shortcomings. One limitation of the ion implantation-formed shallow junctions is the anomalous transient-enhanced diffusion of dopants (e.g. boron or phosphorous) during low-temperature thermal annealing caused by the thermal dissolution of the defect clusters produced during ion implantation. Moreover, the conventional ion implantation techniques are not suitable for uniform doping of high-aspect-ratio trenches. Another problem with ion implantation is that the semiconductor crystal structure is damaged and later, a high temperature thermal anneal process must be performed in order to remove the defects and form electrically activated junctions. Effective removal of the implantation-induced defects in Si requires relatively high thermal annealing temperatures, which further redistribute the dopant and limit the capability to form ultrashallow junctions. Another problem with ion implantation is limited shallowness of the doped junctions due to the channeling effect which can cause a relatively deep implantation tail. Ion implantation is not appropriate for junctions shallower than 1000 Å because of ion channeling at low ion energies, end-of-range implant damage, lateral dopant spreading, and poor throughput and process control at low implant energies (e.g. below 10 keV). Another potential problem with ion implantation is metallic contamination of the substrate during the ion implantation process. In order to achieve junctions with depths on the order of 1000 Å or less, alternative doping methods may have to be utilized. Plasma immersion ion implantation (PIII) allows the formation of ultra-shallow junctions by immersing the substrate in a high-density plasma medium and biasing the wafer without the use of conventional ion implantation; however, PIII, like conventional ion implantation, causes crystal lattice damage. Yet another problem with plasma ion immersion implantation is that impurities such as carbon, hydrogen or other undesirable atoms in the dopant gas molecular formation are also implanted along with the desired dopant atoms, causing junction leakage and manufacturing yield problems.

Another method of doping includes direct gas-phase doping such as rapid thermal gas-phase doping (RTGPD). Gas-phase doping processes of the past involved inorganic dopant gas species such as phosphine, diborane, and arsine. Prior art gas-phase doping processes usually have employed an ambient consisting of diborane mixed with hydrogen ($B_2H_6/H_2$) for p-type doping, to form ultra-shallow boron junctions; or phosphine mixed with hydrogen ($PH_3/H_2$) for n-type doping, to form ultra-shallow phosphorus doped junctions. Moreover, both arsine ($AsH_3$) and tertiarybutylarsine (TBA) have been used in gas-phase doping processes to form shallow arsenic-doped junctions. Some chemicals such as arsine and diborane present toxic hazards to humans and require stringent safety precautions.

During gas-phase doping, the dopant gas molecules are adsorbed on the semiconductor surface. After surface adsorption, dissociation occurs; the chemical bonds between hydrogen and the dopant atoms break, reducing the adsorbed molecules into arsenic, phosphorous, or boron atoms, which subsequently diffuse into the silicon substrate. The surface dissociation byproducts, e.g. hydrogen, then desorb from fie surface to make the surface sites available for chemical adsorption of more dopant species. Gas-phase doping processes may rely on the chemisorption of the dopant species followed by thermally activated surface dissociation of the dopant species and solid-state dopant diffusion to form the doped junction. Gas-phase doping processes usually consist of an in-situ native oxide removal process step prior to the formation of an adsorbed dopant layer on the silicon surface and subsequent solid-phase thermal diffusion of dopants from the adsorbed layer into the silicon substrate. Gas-phase dopants are incorporated into silicon by diffusion in an oxygen-free atmosphere at a medium to high substrate temperature, unlike the conventional furnace predeposition and diffusion processes in which dopant incorporation is performed in an oxygen-rich ambient. Gas-phase doping processes do not produce any damage in silicon and are the most effective when the semiconductor surface is treated using an in-situ surface cleaning process to remove any native oxide layer and establish an atomically clean semiconductor surface.

A significant requirement in sub-half-micrometer, high-performance semiconductor technologies is junction depth reduction (e.g., complementary metal-oxide-semiconductor (CMOS) source/drain; bipolar emitter and base) to suppress MOS punch-through leakage and to minimize device short-channel effects. Device junctions with relatively high surface dopant concentrations (e.g., up to $1 \times 10^{21}$ atoms/cm$^3$), ultra-shallow depths (below 1000 Å), low contact and sheet resistances, and low junction reverse leakage currents (e.g., less than 5 nA/cm$^2$) will be critical for advanced sub-quarter-micrometer semiconductor technologies. Reduced junction depths are required in scaled-down semiconductor technologies. For instance, the source/drain junction depth must be reduced with each new IC technology generation, as the transistor device channel length is reduced. In general, the need for reduced junction depth is driven by technology scaling and improved device performance. Conventional doping methods have shortcomings: the ion implantation processes and current gas-phase doping processes have limitations in terms of minimum junction depth, junction quality, and/or manufacturability.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of a preferred embodiments and alternative embodiments. Corresponding numerals and symbols in the different figures refer to corresponding parts unless otherwise indicated. Table 1 below provides an overview of the elements of the embodiments and the drawings.

TABLE 1

| Drawing Element | Generic Term | Specific Examples or Alternates |
| --- | --- | --- |
| 10 | Semiconductor device | Metal-Oxide Field-Effect Transistor or MOSFET; IGFET |
| 12 | Field insulator | Isolation field oxide |
| 14 | Gate electrode | Gate polysilicon |
| 16 | Sidewall spacer | Oxide sidewall spacer |
| 18 | Substrate | Silicon substrate |
| 20 | Source/drain junctions | |
| 22 | Gate dielectric | Gate oxide |
| 38 | Semiconductor wafer | |
| 50 | Single-wafer rapid thermal processing (RTP) reactor | Automated Vacuum Processor (AVP) RTP System |
| 52 | Gas Distribution Network | Gas Distribution Network with 2 gas Manifolds; a non-plasma and a plasma manifold |
| 54 | Gas line | Nonplasma gas line |
| 56 | Reactor casing | |
| 58 | Chamber wall | Process chamber wall |
| 60 | Pin support plate | |
| 62 | Gas Injector | Showerhead assembly |
| 64 | Plasma line | |
| 66 | Gas line connection | |
| 68 | Microwave discharge cavity | |
| 70 | Plasma tube | Quartz tube |
| 72 | Process chamber | Stainless steel chamber |
| 74 | Plasma output | |
| 76 | Quartz jacket assembly | Quartz liner |
| 78 | Low thermal mass pins | Quartz pins |
| 80 | Optical quartz window | RTP quartz window |
| 84 | Multi-zone illuminator assembly | Tungsten-halogen lamp assembly; lamp |
| 86 | Vacuum Pump connection | |
| 88 | Pumping package | |
| 90 | Isolation gate | Process chamber access gate |
| 92 | Vacuum load-lock chamber | |
| 94 | Vertically moveable bellows | Up/down actuator mechanism |
| 96 | Cassette | |
| 98 | Wafter handling robot | |
| 100 | Vacuum pump connection | |
| 102 | Scatter sensor | Fiber-optic scatter sensor |
| 104 | Process control computer | |
| 106 | Temperature controller | Multi-zone controller |
| 108 | Lamp power supply module | Multi-zone illuminator assembly power supplies |
| 110 | Signal lines | Temperature sensor signals |

FIG. 1 shows an example of a Rapid Thermal Processing (RTP) reactor in which the present gas-phase doping process may be utilized, establishing a typical environment of the present invention. The gas-phase doping process of this invention may be performed in rapid thermal processing (RTP) reactors at process temperatures below 1100° C. Referring to FIG. 1, within a single-wafer RTP reactor 50 such as an Automated Vacuum Processor (AVP), may reside semiconductor wafer 38. Beginning at the bottom right-hand corner of FIG. 1, gas distribution network 52 may comprise two gas manifolds: a non-plasma process gas manifold and a plasma manifold. The gas distribution network 52 contains and distributes the gases discussed in this invention. The non-plasma gas manifold feeds through gas line 54 into reactor casing 56 and process chamber wall 58 to pin support plate 60 and into gas injector 62. The plasma manifold connects through plasma line 64 through connection 66 and into microwave discharge cavity 68. Plasma from microwave discharge cavity 68 feeds through plasma tube 70 which also penetrates reactor casing 56 and process chamber wall 58. Within the process chamber 72, plasma tube 70 passes through pin support plate 60 and through gas injector 62 to plasma output 74. Above quartz jacket assembly 76 and supported by low thermal mass pins 78 appears face-down semiconductor wafer 38. Low thermal mass pins 78 hold semiconductor wafer 38 within process chamber 72.

Process chamber 72 includes optical quartz window 80 through which wafer heating is performed by the multi-zone illuminator assembly 84. In association with tungsten-halogen heating lamp module 84 may be a multi-point temperature sensor (not shown) as described in U.S. Pat. No. 5,156,461 (TI-15188) by Moslehi, et at. issued on Oct. 20, 1992 and assigned to Texas Instruments Incorporated. Vacuum pump connection 86 removes flowing process gas and plasma from process chamber 72 and directs them into pumping package 88. Additionally, isolation gate 90 permits passage of semiconductor wafer 38 from vacuum load-lock chamber 92 into process chamber 72. To permit movement of semiconductor wafer 38 into process chamber 72, a vertically moveable bellows or process chamber up/down actuator mechanism 94 supports process chamber wall 58.

Within vacuum load-lock chamber 92 appears cassette 96 of semiconductor wafers 38 from which wafer handling robot 98 removes a single semiconductor wafer 38 for processing. To maintain load-lock chamber 92 under vacuum, load-lock chamber 92 also includes vacuum pump connection 100 to pumping package 88. Additionally, scatter sensor 102 may be included in load-lock chamber 92 for determining the surface roughness and reflectance of semiconductor wafer 38 for wafer processing measurements according to U.S. Pat. No. 5,293,216 (TI-15198), Sensor for Semiconductor Device Manufacturing Process Control, issued Mar. 8, 1994.

Process control computer 104 receives the multi-point temperature sensor signals, checks the status of multi-zone illuminator 84 for process/equipment diagnosis/prognosis purposes, and provides multiple temperature control signals to multi-zone controller 106 in response to temperature readings of multi-point sensors. The multi-zone controller 106 receives measured multi-point temperature sensor outputs as well as the desired wafer temperature set point (from process control computer 104) and delivers suitable dynamic power set points to the multizone illuminator assembly power supply 108. Signal lines 110 between process control computer 104 and multi-zone illuminator assembly 84 include signals from multi-point temperature sensors from real-time semiconductor wafer 38 temperature measurements and lamp power readings. The combination of rapid thermal annealing and gas-phase doping make possible a degree of control of depth in very shallow (e.g. less than 1000 Å) channels which is unobtainable by any prior art process which does not cause extensive crystal damage.

Gas-phase doping is most effective when the silicon surface is initially treated using an in-situ semiconductor surface cleaning process to remove any native oxide. It is important to make sure the surface is atomically clean, so that there is no residual native oxide to block the gas-phase doping process. The gas-phase doping rate at a given temperature is mostly limited by the processes of surface dissociation and desorption of the hydrogen byproducts from the surface to make more sites available for chemisorption of the dopant species.

The present invention involves using an organic source of a dopant species to dope a semiconductor wafer. The semiconductor wafer is exposed to a process medium in order to dope at least a portion of the surface of the semiconductor wafer, where the process medium is comprised of a dopant gas and the dopant gas comprises an organic source of a dopant species. The wafer is then heated to drive the dopant atoms directly into the existing crystal lattice of the semiconductor surface by surface chemisorption, surface dissociation, and solid state diffusion.

The present invention encompasses a gas-phase doping process based on organic compounds (Tables 2–4.) The dopant may be used in conjunction with a carrier gas (e.g., $H_2$) with or without remote plasma (e.g. hydrogen plasma) for high throughput gas-phase doping. The present invention is a gas-phase doping method and does not involve a material layer deposition or epitaxial growth process.

Tables 2, 3 and 4 show partial lists of some organic dopant sources (Table 2 for boron, Table 3 for phosphorous, and Table 4 and for arsenic) useful for gas-phase doping methods of the present invention. These sources have very low melting points and sufficiently low boiling points to provide sufficient vapor pressure and to enable their gas-phase delivery to the gas-phase doping process environment. Depending on the boiling point, these organic dopant sources may be delivered to the gas-phase doping process environment either using a mass-flow controller or using a liquid-source delivery system (some sources listed are in liquid form at room temperature). Besides the gas dopant source, the liquid dopant sources are also useful since they provide sufficiently high vapor pressures of the organic dopant source when heated, and they may be delivered to the process environment using a liquid delivery system comprising a liquid delivery pump and a heated temperature-controlled vaporizer.

TABLE 2

Boron-Containing Organic Dopant Sources for Direct Gas-Phase Doping (p type doping)

| Organic Dopant Source | Melting Point (°C.) | Boiling Point (°C.) |
| --- | --- | --- |
| $B(CH_3)_3$ trimethyl boron | −161.5 | 20 |
| $B(C_2H_5)_3$ triethyl boron | −92.9 | 95 |
| $B(OCH_3)_3$ trimethoxyboron | −29.3 | 67 |
| $[(CH_3)_2N]_2BF$ bis(dimethylamino)fluoroboron | −44.3 | 106 |
| $(CH_3S)_2BCH_3$ bis(methylthia)methylboron | −59 | 100 |
| $C_6H_5BF_2$ | −36.2 | 97 |

TABLE 2-continued

Boron-Containing Organic Dopant Sources for Direct Gas-Phase Doping (p type doping)

| Organic Dopant Source | Melting Point (°C.) | Boiling Point (°C.) |
| --- | --- | --- |
| phenyl-difluroboron $(CH_3)_2BN(CH_3)_2$ dimethyl(dimethylamino) boron | −92 | 65 |
| $(CH_3)_2BOCH_3$ dimethyl,methoxyboron | — | 21 |
| $CH_3SB(CH_3)_2$ (methylthra)dimethyl boron | −84 | 71 |

TABLE 3

Phosphorous-Containing Organic Dopant Sources for Direct Gas-Phase Doping (n type doping)

| Organic Dopant Source | Melting Point (°C.) | Boiling Point (°C.) |
| --- | --- | --- |
| $(CF_3)_2PH$ bis-trifluoromethyl phosphine | −137 | 1 |
| $(CF_3)_2PCl$ bis(trifluoromethyl)chlorophosphine | — | 21 |
| $(CF_3)_2PCN$ bis(trifluoromethyl)cyanophosphine | — | 48 |
| $(CF_3)_2PI$ bis(trifluoromethyl)iodophosphine | — | 73 |
| $CF_3PCl_2$ dichloro-trifluoromethyl phosphine | — | 37 |
| $(C_2H_5)_2PH$ diethyl phosphine | — | 85 |
| $C_2H_5PH$ ethyl phosphine | <1 | 25 |
| $(CH_3)_2PH$ dimethyl phosphine | <1 | 25 |
| $CH_3PH_2$ methyl phosphine | — | −14 |
| $(C_2H_5)_3P$ triethyl phosphine | −88 | 129 |
| $CF_3PH_2$ trifluoromethyl phosphine | — | −26.5 |
| $(CH_3)_3P$ trimethyl phosphine | −85 | 37.8 |
| $(CF_3)_3P$ tris(trifluoromethyl) phosphine | −112 | 17.3 |

TABLE 4

Arsenic-Containing Organic Dopant Sources for Direct Gas-Phase Doping (n type doping)

| Organic Dopant Source | Melting Point (°C.) | Boiling Point (°C.) |
| --- | --- | --- |
| $(CF_3)_3As$ tris-(trifluoromethyl) arsine | — | 33.3 |
| $(C_2F_5)_3As$ tris-(pentafluoromethyl) arsine | — | 96 |
| $(CH_3)_3As$ trimethyl-arsine | −87.3 | 52 |
| $CF_3AsH_2$ trifluoromethyl-arsine | — | −11.6 |
| $(C_2H_5)_3As$ triethyl arsine | — | 138 |
| $CH_3AsH_2$ methyl arsine | −143 | 2 |
| $C_2H_5AsH_2$ ethyl arsine | — | 36 |

TABLE 4-continued

Arsenic-Containing Organic Dopant Sources for
Direct Gas-Phase Doping (n type doping)

| Organic Dopant Source | Melting Point (°C.) | Boiling Point (°C.) |
|---|---|---|
| $(CH_3)_2AsH$ dimethyl arsine | — | 36 |
| $CH_3AsF_2$ difluoromethyl arsine | −29.7 | 76.5 |
| $C_2H_5AsF_2$ difluoroethyl arsine | −38.7 | 94.3 |
| $(C_2H_5)_2AsH$ diethyl arsine | 1.13 | 105 |
| $CF_3AsCl_2$ dichloro (trifluoromethyl) arsine | — | 7.1 |
| $CF_3AsBr_2$ dibromo-trifluoromethyl arsine | — | 118 |

In the present invention, the dopant source may also comprise a dopant halide gas from the group shown in Table 5. The dopant halide gas may be mixed with an organic dopant source.

TABLE 5

Dopant Halides and Their Physical Properties

| HALIDE | MELTING POINT (°C.) | BOILING POINT (°C.) |
|---|---|---|
| $AsBr_3$ (arsenic tribromide) | 32.8 | 221 |
| $AsCl_3$ (arsenic trichloride) | −8.5 | 130.2 |
| $AsF_5$ (arsenic pentafluoride) | −80 | −53 |
| $BCl_3$ (boron trichloride) | −107.3 | 12.5 |
| $PBr_3$ (phosphorus tribromide) | −40 | 172.9 |
| $PCl_3$ (phosphorus trichloride) | −112 | 75.5 |
| $PCl_2F_3$ | −8 | 10 |
| $PF_5$ (phosphorus pentafluoride) | −83 | −75 |
| $PF_3$ (phosphorus trifluoride) | −151.5 | −101.5 |

Presence of a halogen species (such as Cl, F, or Br) in the gas-phase doping process environment (either in a dopant halide or in a halogen-containing germanium compound) may further assist with cleaning of the semiconductor surface and keeps the surface free of native oxide. (See U.S. patent application, Ser. No. 08/283,979, now Pat. No. 5,599,735 filed Aug. 1, 1994 by Moslehi for "Method for Doped Shallow Junction Formation Using Direct Gas-Phase Doping," TI case number T18197.) Also, small amounts of a germanium-containing compound may be used with organic gas-phase doping processes to further increase the junction surface concentration for a given depth, allowing lower temperatures to be utilized (see U.S. patent application, Ser. No. 08/287,570, now Pat. No. 5,489,550, filed on Aug. 9, 1994 entitled "Improved Gas-Phase Doping Method Using Germanium-Containing Additive" by Moslehi, TI case number T19181).

Figure 2:
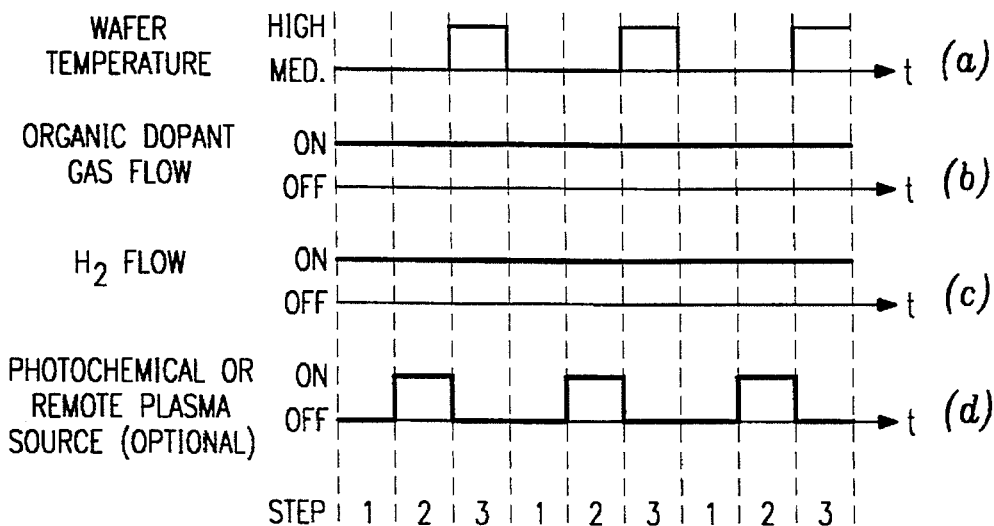
FIG. 2 is a representative timing diagram for a preferred embodiment of the invention, showing a multi-step gas-phase doping process with the following parameters: temperature, the organic dopant gas flow rate, the hydrogen carrier flow rate, and an optional remote $H_2$ plasma source (or an optional photochemical process energy source)
Figure 3:
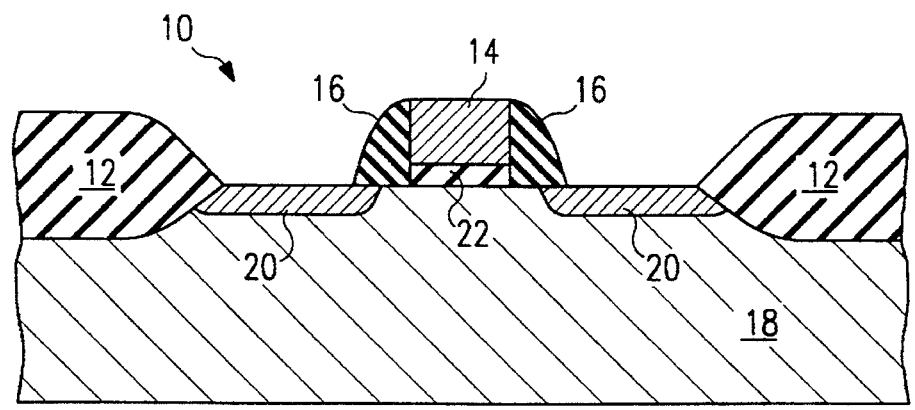
FIG. 3 is a cross-sectional view of a semiconductor device (insulated-gate field-effect transistor or IGFET) upon which this process could be used.
Figure 4:
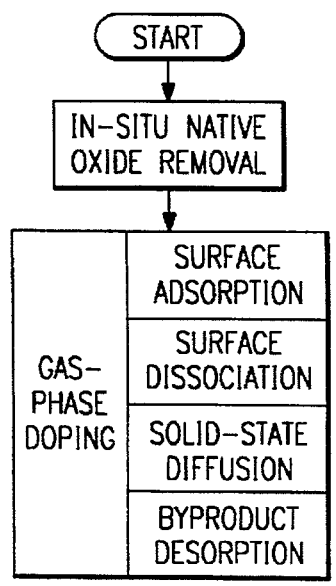
FIG. 4 is a flow diagram depicting the detailed mechanism of the contributing process steps of the invention.

The gas-phase doping method of this invention may be utilized either using continuous substrate heating or using pulsed (multi-step) substrate heating cycles. A timing diagram for a preferred embodiment of a gas-phase doping process using optional remote $H_2$ plasma or photochemical process energy source and organic dopant source is shown in FIG. 2. FIG. 3 is an example of a transistor structure that benefits from the invention. The substrate 18 is exposed to the gases in the invention, doping it and forming, for example, the heavily doped p+ source/drain junction regions 20. The sequential process shown in FIG. 4 is performed after an in-situ surface cleaning process in order to remove native oxide. When the organic dopant source also includes a halogen species (chlorine, fluorine, or bromine), a separate in-situ native oxide removal process may not be required due to the continuous cleaning action of the halogen-containing organic dopant source.

FIG. 2 shows the wafer temperature, the organic dopant source flow rate, hydrogen carrier flow rate, and the state of an optional remote hydrogen plasma source (e.g. a source of microwave discharge that injects hydrogen plasma into the chamber). Instead of hydrogen, another carrier gas may also be used. Each doping cycle is a two or three step process, with the steps described below:

Step 1) A low-to-medium temperature dopant chemisorption step, where the wafer temperature is at a medium setting, the organic dopant source flow rate is on, the hydrogen flow is on, and the optional remote plasma source is off.

Step 2) (Optional) A low-to-medium temperature surface dissociation and desorption of byproduct step with a remote plasma excitation for $H_2$ carrier gas, where the wafer temperature is medium, the organic dopant source flow rate is on, the hydrogen flow is on, and the remote hydrogen plasma source is on. The reaction results in some chemisorption of dopant species on the surface; and Step 3) A higher temperature (e.g. via radiant heating) solid-state diffusion step to drive the dopant atoms into silicon.

These 2 or 3-step gas-phase doping cycles may be repeated as many times as desired, in order to obtain more doping concentration or deeper junctions. The gas-phase doping of this invention may also be performed without multistep cycling of the substrate temperature and with a continuous substrate heating cycle. The gas-phase doping methods of the present invention are preferably performed without the use of a remote plasma source, but a plasma source may nevertheless be utilized. Moreover, the use of a halogen-containing organic dopant source or a halogen-containing germanium compound additive in the gas-phase doping process may allow the elimination of a separate in-situ surface cleaning step, resulting in process simplification.

The novel use of a organic dopant source chemistries for use with direct gas-phase doping offers definite advantages over other doping processes. The dopants are imbedded directly into the crystal structure of the substrate, eliminating a deposition step. Since the use of the plasma source described in step 2) above is optional and is not required, the present invention does not depend on ion implantation and thus results in no crystal damage and no need for a subsequent high temperature anneal to repair the crystal damage. The process described herein may be performed at 0 eV, whereas with PIII methods such as Sato et at. '381, high energy (e.g. 600 V) must be used to generate the glow discharge. Even the use of the optional remote microwave (or remote inductively coupled RF) plasma energy source in this invention will only result in transport of low-energy activated neutral species to the semiconductor substrate, eliminating the possibility of ion implantation and substrate damage. Also, with other methods of ion implantation, atoms other than the desired dopant may be driven into the semiconductor surface. With the present invention, the solid-state diffusion of the dopant atoms is selective only to the dopant species.

The above processes can be performed with purely thermal doping, or with a combination of thermal and remote plasma; such as the addition of remote hydrogen plasma. The sequential multiprocessing gas-phase doping process based on the combination of thermal and remote plasma or photochemical process energy sources to enhance the chemisorption, surface dissociation, and byproduct desorption processes is also novel and offers potentially significant advantages over the conventional chemistries and methods of gas-phase doping. In addition, the use of organic dopants is easier because highly toxic gases such as arsine or diborane are not used. The organic sources of the present invention may be used for gas-phase doping over a wide range of process pressures. Higher pressures, in addition to the thermal activation, decrease the doping time and reduce the required substrate temperature. Wafer heating may be performed using lamps such as in rapid thermal processing (RTP) systems or using a resistive or radiative heat source.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A direct doping method for semiconductor wafers, comprising the steps of:

providing a semiconductor wafer having a surface;

exposing said surface of said wafer to a non-ionized process medium in order to directly dope at least a portion of said surface of said wafer, wherein said process medium comprises a dopant gas, and wherein said dopant gas comprises an organic compound of a dopant species, wherein said organic compound is a material selected from the group consisting of $(CF_3)_2PCl$, $(CF_3)_2PCN$, $(CF_3)_2PI$, $CF_3PCl_2$, $(C_2H_5)_2PH$, $(CH_3)_2PH$, $C_2H_5PH_2$, and $CH_3PH_2$; and heating said wafer, thermally activating said doping method and causing solid state diffusion of said dopant species into said semiconductor wafer surface in order to dope at least portions of said surface of said semiconductor wafer with n type doping, wherein said dopant species is phosphorus and wherein said doping is performed without the presence of plasma.

2. The method of claim 1 wherein said process medium also comprises a carrier gas.

3. The method of claim 2 wherein said carrier gas is hydrogen.

4. The method of claim 1 wherein said gas-phase doping method is conducted in a thermal processing reactor.

5. The method of claim 4 wherein said thermal processing reactor is rapid thermal processing equipment.

6. The method of claim 1 wherein said organic compound further comprises a halogen species in its molecular structure.

7. The method of claim 6 wherein said process medium further comprises an etch-suppressing additive.

8. The method of claim 7 wherein said etch-suppressing additive comprises silicon in its molecular structure.

9. The method of claim 8 wherein said etch-suppressing additive is a material selected from the group consisting of silicon tetrachloride, silicon tetrafluoride, and dichlorosilane.

10. The method of claim 1 wherein said semiconductor wafer is heated to a temperature in the range of 650° C. and 1150° C.

11. The method of claim 1 wherein said process medium has a total pressure in the range of 1 Torr to atmospheric pressure.

12. The method of claim 1 wherein said doping process is performed in a high-pressure chamber, and wherein said process medium has a total pressure in the range of 1 atmosphere to 100 atmospheres.

13. The method of claim 1 wherein said process medium further comprises a germanium-containing gas.

14. A thermally activated direct doping method for semiconductor wafers, comprising the steps of:

providing a semiconductor wafer having a surface;

exposing said surface of said wafer to a process medium in order to directly dope at least a portion of said surface of said wafer, wherein said process medium comprises a dopant gas, and wherein said dopant gas comprises an organic compound of a dopant species, wherein said organic compound is a material selected from the group consisting of $(CF_3)_2PCl$, $(CF_3)_2PCN$, $(CF_3)_2PI$, $CF_3PCl_2$, $(C_2H_5)_2PH$, $(CH_3)_2PH$, $(CH_3)_2PH$, $C_2H_5PH_2$, and $CH_3PH_2$, wherein said doping method is conducted in a thermal processing reactor; and heating at least said semiconductor wafer to facilitate the surface chemisorption, surface dissociation, and solid-state diffusion of said dopant species directly into said surface of said semiconductor wafer to produce a doped junction having a depth of less than 1000 Å, doping at least portions of said surface of said semiconductor wafer with n type doping, wherein said dopant species is phosphorus.

15. The method of claim 14 wherein said doping method further comprises exposing said wafer and said dopant gas to a remote plasma gas.

16. The method of claim 14, wherein said heating step is performed by rapid thermal equipment.

17. A direct doping method for semiconductor wafers, comprising the steps of:

providing a semiconductor wafer having a surface;

exposing said surface of said wafer to a non-ionized process medium in order to directly dope at least a portion of said surface of said wafer, wherein said process medium comprises a dopant gas and a germanium-containing gas, and wherein said dopant gas comprises an organic compound of a dopant species, wherein said organic compound is a material selected from the group consisting of $(CF_3)_2PCl$, $(CF_3)_2PCN$, $(CF_3)_2PI$, $CF_3PCl_2$, $(C_2H_5)_2PH$, $(CH_3)_2PH$, $C_2H_5PH_2$, and $CH_3PH_2$; and heating said wafer, thermally activating said doping method and causing solid state diffusion of said dopant species into said semiconductor wafer surface in order to dope at least portions of said surface of said semiconductor wafer with n type doping, wherein said dopant species is phosphorus and wherein said doping is performed without the presence of plasma.

18. The method of claim 17 wherein said process medium also comprises a carrier gas.

19. The method of claim 18 wherein said carrier gas is hydrogen.

20. The method of claim 17 wherein said gas-phase doping method is conducted in a thermal processing reactor.

21. The method of claim 20 wherein said thermal processing reactor is rapid thermal processing equipment.

22. The method of claim 17 wherein said organic compound further comprises a halogen species in its molecular structure.

23. The method of claim 22 wherein said process medium further comprises an etch-suppressing additive.

24. The method of claim 23 wherein said etch-suppressing additive comprises silicon in its molecular structure.

25. The method of claim 24 wherein said etch-suppressing additive is a material selected from the group consisting of silicon tetrachloride, silicon tetrafluoride, and dichlorosilane.

26. The method of claim 17 wherein said semiconductor wafer is heated to a temperature in the range of 650° C. and 1150° C.

27. The method of claim 17 wherein said process medium has a total pressure in the range of 1 Torr to atmospheric pressure.

28. The method of claim 17 wherein said doping process is performed in a high-pressure chamber, and wherein said process medium has a total pressure in the range of 1 atmosphere to 100 atmospheres.

29. A thermally activated direct doping method for semiconductor wafers, comprising the steps of:

providing a semiconductor wafer having a surface;

exposing said surface of said wafer to a process medium in order to directly dope at least a portion of said surface of said wafer, wherein said process medium comprises a dopant gas and a germanium-containing gas, and wherein said dopant gas comprises an organic compound of a dopant species, wherein said organic compound is a material selected from the group consisting of $(CF_3)_2PCl$, $(CF_3)_2PCN$, $(CF_3)_2PI$, $CF_3PCl_2$, $(C_2H_5)_2PH$, $(CH_3)_2PH$, $C_2H_5PH_2$, and $CH_3PH_2$, wherein said doping method is conducted in a thermal processing reactor; and heating at least said semiconductor wafer to facilitate the surface chemisorption, surface dissociation, and solid-state diffusion of said dopant species directly into said surface of said semiconductor wafer to produce a doped junction having a depth of less than 1000 Å, doping at least portions of said surface of said semiconductor wafer with n type doping, wherein said dopant species is phosphorus.

30. The method of claim 29 wherein said doping method further comprises exposing said wafer and said dopant gas to a remote plasma gas.

31. The method of claim 29 wherein said heating step is performed by rapid thermal equipment.

* * * * *